United States Patent [19]
Bowers

[11] Patent Number: 5,853,962
[45] Date of Patent: Dec. 29, 1998

[54] PHOTORESIST AND REDEPOSITION REMOVAL USING CARBON DIOXIDE JET SPRAY

[75] Inventor: Charles W. Bowers, Torrance, Calif.

[73] Assignee: Eco-Snow Systems, Inc., Livermore, Calif.

[21] Appl. No.: 814,792

[22] Filed: Oct. 4, 1996

[51] Int. Cl.$^6$ ................ G03C 5/00; B08B 3/00
[52] U.S. Cl. ............ 430/331; 430/329; 134/72; 134/201; 134/902
[58] Field of Search .............. 134/201, 93, 902, 134/72; 430/331, 329

[56] References Cited

U.S. PATENT DOCUMENTS

| | | | |
|---|---|---|---|
| 4,747,421 | 5/1988 | Hayashi | 134/201 |
| 5,125,979 | 6/1992 | Swain et al. | 134/7 |
| 5,315,793 | 5/1994 | Peterson et al. | 51/415 |
| 5,378,312 | 1/1995 | Gifford et al. | 156/643 |
| 5,766,061 | 6/1998 | Bowers | 451/89 |
| 5,766,368 | 6/1998 | Bowers | 134/6 |

*Primary Examiner*—Kathleen Duda
*Assistant Examiner*—Rosemary Ashton
*Attorney, Agent, or Firm*—R. Craig Armstrong

[57] ABSTRACT

A method of removing photoresist or redeposited material from a substrate or other surface using a carbon dioxide jet spray. A substrate having photoresist or redeposited material on its surface is disposed in an environmental enclosure. A carbon dioxide jet spray is generated and directed onto the surface of the substrate and photoresist or redeposited material. The carbon dioxide jet spray cools or freezes the material and causes a mismatch in the thermal coefficient of expansion of the material and the substrate. The material debonds from the substrate due to the induced thermal shock to the material. This rapid shrinkage loosens the material and allows the solid particles in the spray to knock the material from the surface of the substrate. The removed photoresist or redeposited material may be collected in a filter, and removed.

4 Claims, 3 Drawing Sheets

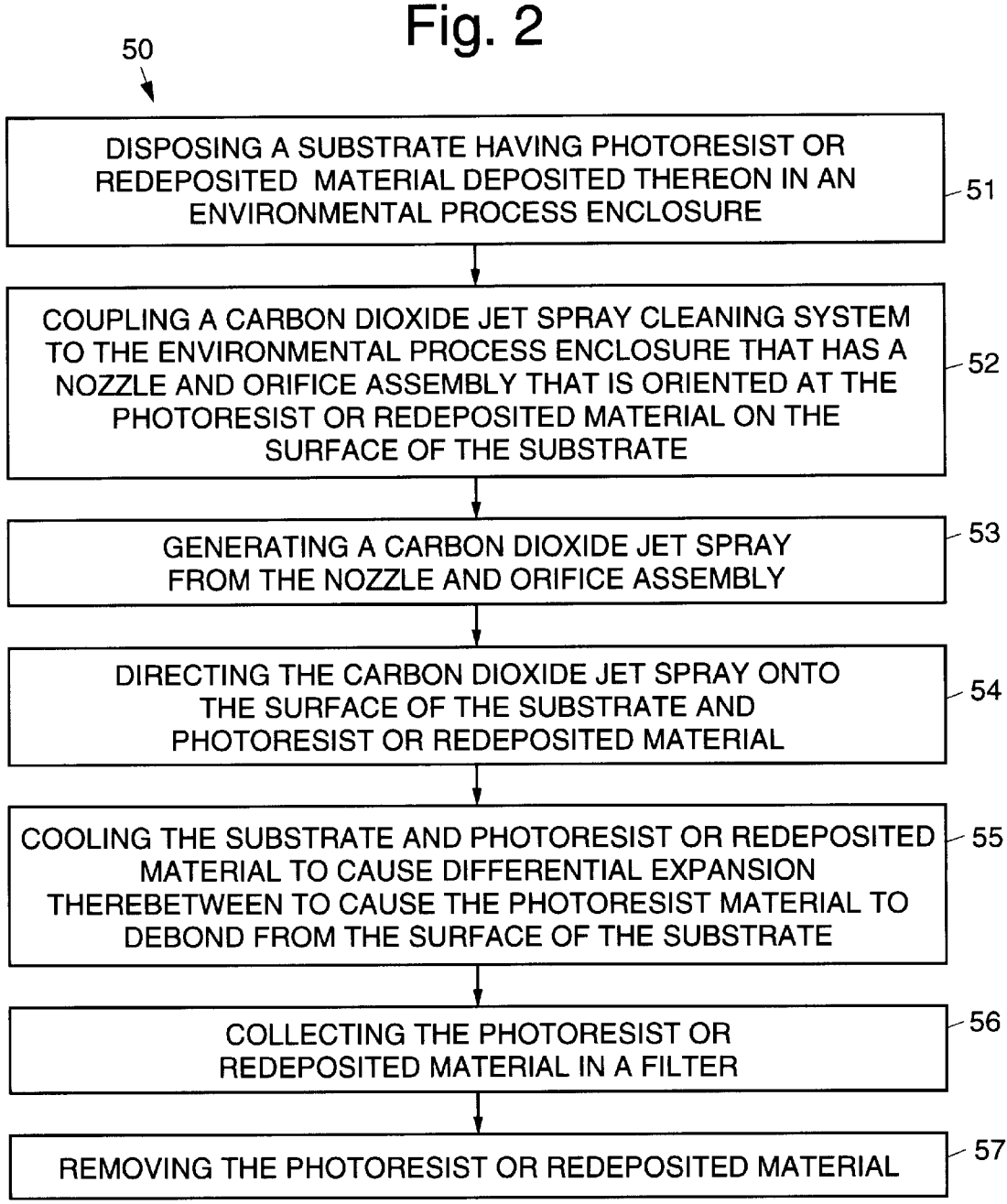

PHOTORESIST AND REDEPOSITION REMOVAL USING CARBON DIOXIDE JET SPRAY

BACKGROUND

The present invention relates generally to processes for removing photoresist material from substrates and material that is redeposited onto surfaces of substrates, and the like, and more particularly, to the use of a cryogenic aerosol, such as liquid carbon dioxide snow, to remove photoresist and redeposited material from substrates.

Photoresist is a polymer material that is used during lithography processes to define and build semiconductor and other microelectronic devices. The polymer photoresist material is very difficult to remove from the surface of substrates, even using bio-hazardous chemicals such as n-methyl-pyrolidinone, for example.

In conventional semiconductor manufacturing processes, a substrate is patterned using a photoresist layer that is masked and then ion milled or chemically etched. The photoresist material that is remove during the milling operation redeposits on sides of edgewalls formed on the surface. The patterned surface has features that are typically 100–1000 Angstroms thick. The redeposited photoresist material produces sharp lithography features that are also on the order of 1000 Angstroms thick. These sharp lithography features cause shorting between metal layers that are subsequently deposited over the lithography features.

Conventional removal of the remaining photoresist material is accomplished by washing and mechanically scrubbing the surface of the substrate using n-methylpyrolidinone (NMP), for example. The n-methyl-pyrolidinone is a toxic chemical. After the n-methyl-pyrolidinone removes the photoresist material, it must be disposed of, which is a costly procedure.

Therefore, it would be an advance in the art to have a process of removing photoresist material deposited onto substrates or other surfaces that does not require the use or removal of hazardous chemicals. It would also be an advance in the art to have a process of removing photoresist material deposited onto substrates or other surfaces that does not leave a residue after cleaning.

Accordingly, it is an objective of the present invention to provide for a method of using a cryogenic aerosol, such as carbon dioxide snow, to remove photoresist and redeposited material from substrates or other surfaces. The use of carbon dioxide jet spray or snow to remove photoresist material deposited onto substrates or other surfaces has not heretofore been done.

SUMMARY OF THE INVENTION

To meet the above and other objectives, the present invention provides for a method of removing photoresist material from a substrate, or material that is redeposited onto the substrate, or other surface, using a liquid carbon dioxide snow. The carbon dioxide snow comprises solid aerosol particles and gas and is sprayed using a pressurized tank of liquid carbon dioxide and a nozzle and orifice assembly onto a substrate having photoresist material thereon. An aggressive spray (containing many high speed gas particles) may be oriented at an angle of between 30 and 45 degrees with respect to the surface of the substrate to obtain optimal cleaning.

The carbon dioxide snow freezes the photoresist material and causes a mismatch in the thermal coefficient of expansion of the photoresist material and the substrate. Consequently, the photoresist material debonds from the substrate. The momentum transfer between the gas particles (snow) and the debonded photoresist material sweeps it from the surface of the substrate. The cryogenic aerosol thus induces a large thermal shock to the photoresist material causing rapid shrinkage thereof. This rapid shrinkage loosens the photoresist and allows the solid gas particles to knock the photoresist from the surface. The surface is left extremely clean and free from photoresist material. The removed photoresist material is collected in a high efficiency particulate air (HEPA) filter, or high flow ultra low particulate air (ULPA) filter for removal and disposal.

Contrary to common belief, plastic substrate material, such as is used in fabricating optical disks, for example, has been found to absorb water, which promotes debonding of the photoresist material from such surfaces using the present method. The mismatch in the thermal coefficient of expansion of the photoresist and the substrate causes debonding or delamination of the photoresist from the substrate.

The cryogenic aerosol produced by expanding a gas, such as liquid carbon dioxide ($CO_2$), produced by an ECO-SNOW™ jet spray system, for example, has been shown to remove some types of photoresist material without the use of hazardous chemicals. For example, use of the carbon dioxide jet spray is the only process proven to remove a positive photoresist that has been previously removed only using n-methylpyrolidinone.

Using the present invention, there is no liquid waste to dispose of, and liquid carbon dioxide is non-toxic. Therefore, the present process is completely environmentally friendly. Dry polymer photoresist material is also not hazardous to the environment and may be disposed of in a cost-effective manner.

The present invention may be used in applications relating to semiconductor, disc drive, and flat panel display manufacture. The manufacturing processes used in each of these three applications have a large number of lithography steps that can beneficially use the present invention.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 2 is a flow diagram illustrating one method of removing photoresist and redeposited material from substrates or other surfaces in accordance with the present invention.

DETAILED DESCRIPTION

Figure 1:
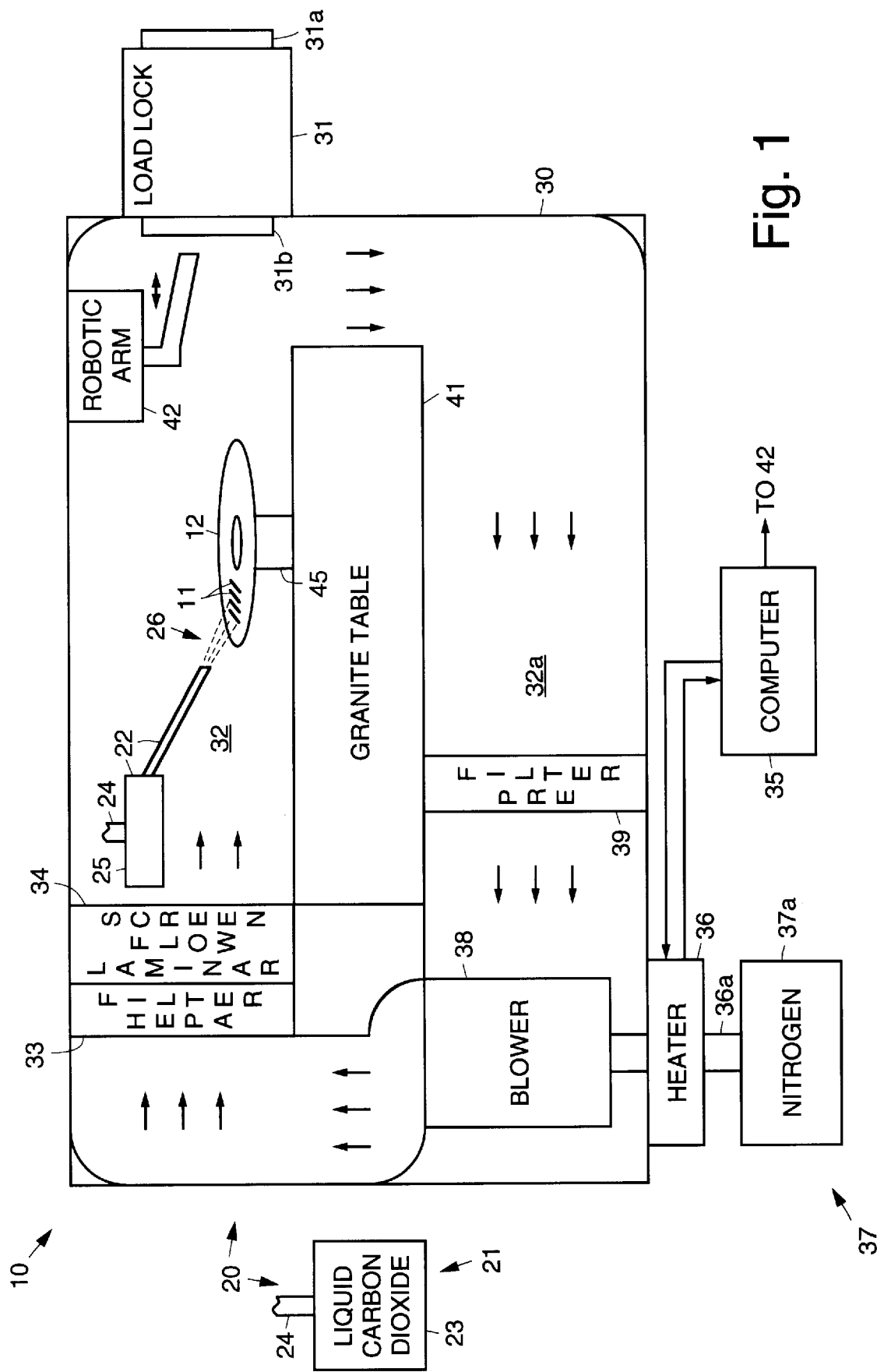
FIG. 1 illustrates removal of photoresist and redeposited material from substrates or other surfaces using a carbon dioxide jet spray in accordance with the principles of the present invention.

Referring to the drawing figures, FIG. 1 illustrates removal of photoresist material 11 and redeposited material 11 from a substrate 12 or other surface 12 by means of a carbon dioxide jet spray 26 using a method 50 in accordance with the principles of the present invention. A cryogenic aerosol cleaning system 20, such as an ECO-SNOW carbon dioxide jet spray cleaning system 20 manufactured by the assignee of the present invention, is used in conjunction with a controlled, ultra pure, environmental process enclosure 30 to remove the photoresist material 11 or redeposited material 11 from the substrate 12 or other surface 12.

The carbon dioxide jet spray cleaning system 20 includes a delivery system 21 that is coupled to a valve assembly 25 disposed in the environmental process enclosure 30. The carbon dioxide jet spray delivery system 21 has a carbon dioxide tank 23 and tubing 24 coupled between the tank 23 and the valve assembly 25. The valve assembly 25 is coupled to a nozzle and orifice assembly 22. The nozzle and orifice assembly 22 produces a spray 26 of gaseous and solid carbon dioxide material that is used to remove the photoresist material 11 from the substrate 12 or other surface 12.

The ultra clean environmental process enclosure 30 has a loadlock pass-through 31 having front and rear access doors 31a, 31b. A high efficiency particulate air (HEPA) filter 33, or high flow ultra low particulate air (ULPA) filter 33 and laminar flow screen 34 are disposed in an inner processing chamber 32 of the environmental process enclosure 30. The environmental process enclosure 30 also includes a temperature controller 35 (and which may be provided by a computer 35) that is coupled to a heater 36 that surrounds a nitrogen or dry air inlet filter 36a. A high scfm capacity recirculation blower 38 is disposed in the enclosure 30 for circulating air through the enclosure 30, and a nitrogen or dry air (purified gas) purging system 37 including a nitrogen or dry air tank 37a is coupled through the inlet filter 36a to the blower 38. A prefilter 39 is disposed prior to an inlet of the blower 36 such as in a return duct 32a of the enclosure 30. The use of the filter 33, laminar flow screen 34 and prefilter 39 results in purified uncontaminated air containing no more than about 1–2 parts per million of contaminant particles.

A granite table 41 is disposed in the inner processing chamber 32 of the environmental process enclosure 30. The valve assembly 25 and the nozzle and orifice assembly 22 are disposed on the granite table 41 and are arranged so that the spray 26 of gaseous and solid carbon dioxide snow is directed onto the surface of the substrate 12 that has the photoresist material 11 disposed thereon.

The liquid carbon dioxide snow spray 26 is produced by feeding liquid carbon dioxide from the pressurized tank 23 to the nozzle and orifice assembly 22 which emits the snow spray 26 that is directed onto the surface of the substrate 12 and the photoresist material 11. An aggressive spray 26 (containing many high speed gas or snow particles) is optimally oriented at an angle of between 30 and 45 degrees with respect to the surface of the substrate 12.

The carbon dioxide jet spray 26 freezes the photoresist material 11 and causes a mismatch in the thermal coefficient of expansion of the photoresist material 11 and the substrate 12. Consequently, the photoresist material 11 debonds from the substrate 12. The momentum transfer between the gas particles (snow) and the debonded photoresist material 11 sweeps the debonded photoresist material 11 from the surface of the substrate 12. The carbon dioxide snow thus induces a large thermal shock to the photoresist material 11 causing rapid shrinkage thereof. This rapid shrinkage loosens the photoresist material 11 and allows the solid particles in the snow spray 26 to knock the photoresist material 11 from the surface of the substrate 12. The surface of the substrate 12 is left extremely clean and free from photoresist material 11. The removed photoresist material 11 is collected in the filter 33, such as the high efficiency particulate air (HEPA) filter 33, or high flow ultra low particulate air (ULPA) filter 33 for removal and disposal.

For the purposes of completeness, FIG. 2 is a flow diagram illustrating an exemplary method 50 of removing photoresist material 11 from a substrate 12 or other surface 12 in accordance with the present invention. The method 50 comprises the following steps. A substrate 12 having photoresist material 11 deposited thereon is disposed 51 in an environmental process enclosure 30. A carbon dioxide jet spray cleaning system 20 is coupled 52 to the environmental process enclosure 30 that has a nozzle and orifice assembly 22 that is oriented at the photoresist material 11 disposed on the surface of the substrate 12. A carbon dioxide jet spray 26 comprising gaseous and solid carbon dioxide material is generated 53 by the nozzle and orifice assembly 22. The spray 26 is directed 54 onto the surface of the substrate 12 including the photoresist material 11. An aggressive carbon dioxide jet spray 26 is used and is oriented at an angle of between 30 and 45 degrees with respect to the surface of the substrate 12. The photoresist material 11 and the substrate 12 are cooled 55 by the spray 26 which causes differential expansion of the photoresist material 11 relative to the substrate 12 because of their respective coefficients of thermal expansion. The cooling causes the photoresist material 11 to debond or delaminate from the surface of the substrate 12. The photoresist material 11 is collected 56 by a filter 33 and removed 57.

Figure 3A:
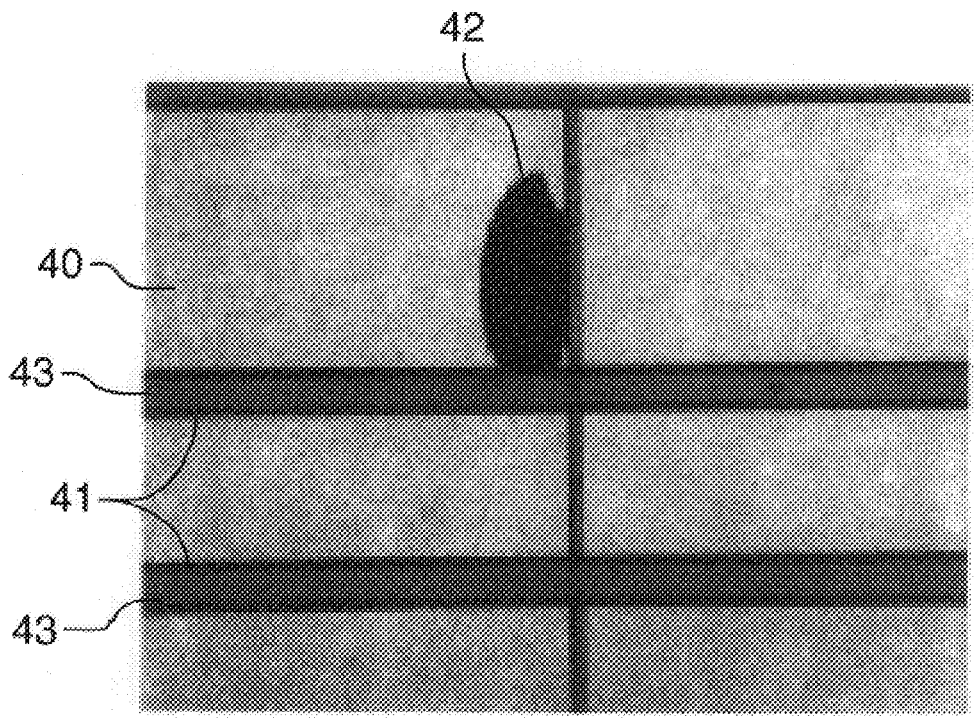
FIGS. 3a and 3b are digitized reproductions of before and after photographs showing removal of photoresist from air bearing rails of a TiC/$Al_2O_3$ magnetoresistive head using the present method.
Figure 3B:
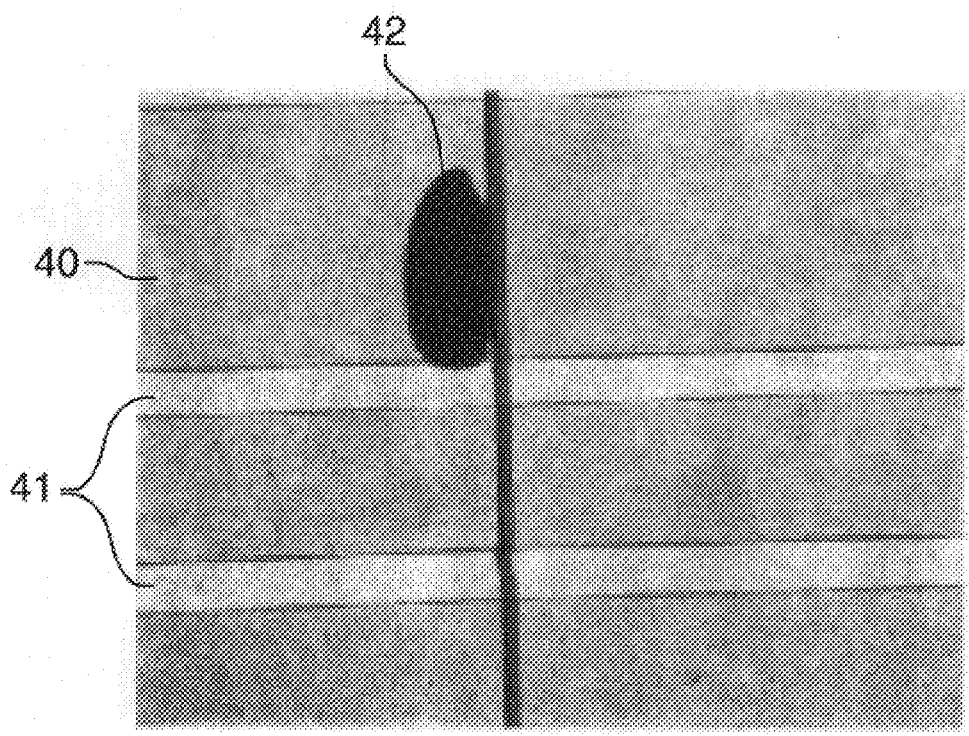

FIGS. 3a and 3b are digitized reproductions of before and after photographs showing removal of photoresist from air bearing rails 41 formed on a TiC/Al$_2$O$_3$ magnetoresistive head 40 using the present method 50. FIGS. 3a and 3b show a "defective" magnetoresistive head 40 used for test purposes. The magnetoresistive head 40 has an oblong defect 42 shown in the upper portions of the figures. In FIG. 3a, the air bearing rails 41 have Dupont Reston™ photoresist 43 deposited thereon and are the dark horizontal stripes in the figure. In FIG. 3b, the photoresist 43 has been removed by spraying the surface of the head 40 with carbon dioxide snow in accordance with the present method 50. As is shown in FIG. 3b, the photoresist 43 has been completely removed from the air bearing rails 41 which are now clear horizontal stripes in the figure. The magnetoresistive head 40 was not damaged by the cleaning method 50 and the photoresist 43 was completely removed.

Thus, a method of removing photoresist material from a substrate, or material that is redeposited onto the substrate, or other surface, using carbon dioxide snow has been disclosed. It is to be understood that the described embodiments are merely illustrative of some of the many specific embodiments which represent applications of the principles of the present invention. For example, other cryogenic aerosol materials, such as nitrous oxide, argon and xenon, for example, may be used in place of carbon dioxide in practicing the present invention. Clearly, numerous and other arrangements can be readily devised by those skilled in the art without departing from the scope of the invention.

What is claimed is:

1. A method of removing photoresist or material redeposited from photoresist removal from a surface of a substrate, said method comprising the steps of:

disposing a substrate having photoresist or material redeposited from photoresist removal deposited on its surface in an environmental process enclosure;

coupling a carbon dioxide jet spray cleaning system to the environmental process enclosure that has a nozzle and orifice assembly that is oriented towards the photoresist material;

generating a carbon dioxide jet spray using the nozzle and orifice assembly;

directing the carbon dioxide jet spray onto the surface of the substrate and the photoresist or material redeposited from photoresist removal;

cooling the photoresist or material redeposited from photoresist removal and the substrate using the carbon dioxide jet spray to cause differential expansion of the photoresist or material redeposited from photoresist removal relative to the substrate and debonding of the photoresist or material redeposited from photoresist removal from the surface of the substrate without erosion of the substrate;

collecting the photoresist or material redeposited from photoresist removal; and removing the photoresist or material redeposited from photoresist removal.

2. The method of claim 1 wherein the step of generating the carbon dioxide jet spray comprises the step of generating an aggressive carbon dioxide jet spray.

3. The method of claim 1 wherein the carbon dioxide jet spray is oriented at an angle of between 30 and 45 degrees with respect to the surface of the substrate.

4. The method of claim 1 wherein the step of collecting the photoresist or redeposited material comprises the step of collecting the photoresist material using a filter.

* * * * *